United States Patent [12]
Lehner

(10) Patent No.: US 7,245,026 B2
(45) Date of Patent: Jul. 17, 2007

(54) CONFIGURATION AND METHOD FOR CONTACTING CIRCUIT STRUCTURE

(75) Inventor: Rudolf Lehner, Laaber (DE)

(73) Assignee: Infineon Technologies AG, Munich (DE)

( * ) Notice: Subject to any disclaimer, the term of this patent is extended or adjusted under 35 U.S.C. 154(b) by 208 days.

(21) Appl. No.: 10/174,057

(22) Filed: Jun. 17, 2002

(65) Prior Publication Data
US 2002/0173081 A1 Nov. 21, 2002

Related U.S. Application Data

(63) Continuation of application No. PCT/DE00/04481, filed on Dec. 15, 2000.

(30) Foreign Application Priority Data
Dec. 16, 1999 (EP) ................... 99125114

(51) Int. Cl.
H01L 23/48 (2006.01)
(52) U.S. Cl. ............. 257/782; 438/108; 438/118; 257/784
(58) Field of Classification Search ........ 257/666, 257/777, 202–204, 723, 668, 671, 674, 672, 257/690, 779, 782, 784, 686; 438/123, 106, 438/108, 118, 618
See application file for complete search history.

(56) References Cited

U.S. PATENT DOCUMENTS 4,044,816 A * 8/1977 Krueger et al. ............... 164/63
4,100,675 A * 7/1978 Landsittel ..................... 29/827
4,215,359 A   7/1980 Schermer et al.
4,857,671 A * 8/1989 Nakano et al. ............. 174/259
4,887,758 A  12/1989 Suzuki et al.
5,288,007 A * 2/1994 Interrante et al. ........... 228/119
5,393,705 A * 2/1995 Sonobe ....................... 437/217
5,395,038 A   3/1995 Olson et al.
5,643,802 A * 7/1997 Yamashita ............... 228/110.1
5,869,898 A * 2/1999 Sato ........................... 257/728
6,096,577 A * 8/2000 Hashimoto .................. 438/116

FOREIGN PATENT DOCUMENTS

EP    0 338 232 A2    10/1989
EP    0 338 232 A3    10/1989
GB    2 177 639 A      1/1987
JP    59 211 240      11/1984
JP    61 079 239       4/1986

* cited by examiner

Primary Examiner—Tuan H. Nguyen
(74) Attorney, Agent, or Firm—Laurence A. Greenberg; Werner H. Stemer; Ralph E. Locher

(57) ABSTRACT

A configuration and method for contacting a circuit is described. A carrier is disposed adjacent a circuit, and a setting element at which an electrical connection formed of a conductive material is disposed, so that the electrical connection connects the circuit to the carrier in a bonding process. In this manner an efficient and cost effective method for connecting the circuit to carrier is performed.

8 Claims, 3 Drawing Sheets

CONFIGURATION AND METHOD FOR CONTACTING CIRCUIT STRUCTURE

CROSS-REFERENCE TO RELATED APPLICATION

This application is a continuation of copending International Application No. PCT/DE00/04481, filed Dec. 15, 2000, which designated the United States and was not published in English.

BACKGROUND OF THE INVENTION

Field of the Invention

The present invention relates to a configuration and a method for the contacting of circuits.

Circuits and integrated circuits are contacted with a carrier material and packaged in housings for further processing.

Contacting with a carrier material is known from Published, British Patent Application GB 2 177 639 A. There, an integrated circuit is contacted with a carrier material by an ultrasonic wire bonder. The carrier material is a lead frame. Another reference for wire bonding is U.S. Pat. No. 5,395,038.

A wire bonder utilizes a long wire (what is known as an endless wire) that is located on a spool. The processing end of the endless wire is threaded through the bonding machine and led to the position to be contacted with the aid of a cannula.

In what is known as ball bonding, the processing end of the endless wire is melted by heat and ultrasound and connected to the contact pad of the integrated circuit, which is located on the integrated circuit, thereby forming a ball; hence the name ball bonding. Next, a position on the lead frame is approached with the cannula and the bonding wire inside it, and the bonding wire is joined to the lead frame. Now the bonding wire is cut, and the cannula with the bonding wire moves to the next position for forming an electrical connection.

Another method for contacting integrated circuits is what is known as wedge-wedge bonding. Here, the bonding wire is not melted by heat, but rather pressed or rubbed by a stamp on one side of the cannula.

The disadvantage of both techniques is their utilization of a bonding wire, because this is usually made of gold and is therefore expensive. Given thick bonding wires, the price of gold is the largest cost factor; for thin bonding wires, the finishing technology for creating a conformal, thin and homogenous wire is the largest cost factor.

Another disadvantage is that only one bond connection at a time in succession can be produced with wire bonding. For integrated circuits with 1,000 contacts or more, this leads to a long production time, which raises costs.

The long production time can be shortened with what is known as the flip chip technique, which is described in U.S. Pat. No. 4,887,758, for example. To accomplish this, a lead frame is utilized, whose electrical lines are disposed in such a way that they reach exactly to the electrical contact pads of the integrated circuit. The electrical lines of the lead frame are simultaneously pressed to all contact pads of the integrated circuit and connected in one process.

But the disadvantage of the flip chip technique is that only one chip can be joined with the lead frame. However, two or more individual chips are often packaged in one housing and electrically contacted. In this case, the flip chip technique is incapable of producing an electrical connection between two chips in a housing.

SUMMARY OF THE INVENTION

It is accordingly an object of the invention to provide a configuration and a method for the contacting of circuits that overcome the above-mentioned disadvantages of the prior art methods and devices of this general type, which makes possible the simultaneous contacting of all electrical contacts.

With the foregoing and other objects in view there is provided, in accordance with the invention, a method for contacting a circuit. The method includes placing a conductive material into a mold to form at least one electrical connection adhering to a setting element; disposing a carrier adjacent to the circuit; and moving the setting element, to which the electrical connection formed of the conductive material adheres, next to the circuit and the carrier, so that the electrical connection conductively joins the circuit and the carrier.

The advantage of the invention is that at least two bond connections can simultaneously join the circuit to the carrier in one bonding process. In the best case, it is even possible to form all bond connections at the same time.

Another advantage consists in the possibility to form electrical connections between two integrated circuits that are disposed in a housing. It is also possible to dispose the substrates of two integrated circuits on top of each other and to form the electrical connections between the integrated circuits. The bonding processes can also be executed in parallel fashion in one step.

A particularly advantageous inventive solution is the utilization of a casting technique for forming the bond connections. Bond connections that have to carry large currents can be constructed wider and thicker than those that have to carry small loads. In addition, the cost-intensive fabricating of a bonding wire is forgone.

The method makes possible the simultaneous contacting of more than one electrical contact between the carrier and the integrated circuit or between two integrated circuits which are on separate chips but which are to be packaged in one housing, given the disposing of an additional electrical connection at the setting element.

In a particularly advantageous embodiment of the invention, all electrical connections between the circuit and the carrier are disposed at the setting element, so that they can connect the circuit and the carrier simultaneously in one bonding process. This technique saves an enormous amount of time compared to wire bonding, which is expressed in a cost reduction.

In another advantageous embodiment of the invention, the conductive material is disposed in a mold for casting, whereby a portion of the mold consists of the setting element. The configuration makes it possible to cast the electrical connections between the circuit and carrier in the mold and to open the mold later, in such a way that the conductive connections remain on the setting element for the time being.

In another advantageous embodiment of the inventive configuration, the conductive material is formed at least partly of gold, copper and/or aluminum. This way, it is possible to utilize metals and metal alloys that are not formed exclusively of expensive gold, but rather of more favorable highly conductive copper or aluminum. A problem that usually arises in the attempt to produce bonding wires from copper is that copper oxidizes before it can produce an electrical connection. This problem can be handled by wrapping the copper in a gold sheath during the bonding wire fabrication. But the sheathing process is expensive.

In another advantageous development of the inventive method, into the mold—which is formed of at least two mold sections, one of which is the setting element—is disassembled into its sections, whereby the electrical connection remains with the setting element. This makes possible the casting of the electrical connections and the separation of the mold, whereby the electrical connections emerge directly at the provided positions in the set matrix.

In an advantageous embodiment of the inventive method, the electrical connections between the circuit and carrier are produced by pressing the setting element by ultrasound and/or heat. The advantage of the technique is that the electrical connections are joined to the circuit and carrier directly at the positions provided for said connections.

In an advantageous development of the inventive method, the setting element is removed from the circuit and the carrier subsequent to the bonding process. In the process, the electrical connections between the circuit and the carrier remain, and the setting element detaches from the electrical connections and is removed from the circuit and carrier.

Other features which are considered as characteristic for the invention are set forth in the appended claims.

Although the invention is illustrated and described herein as embodied in a configuration and a method for the contacting of circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
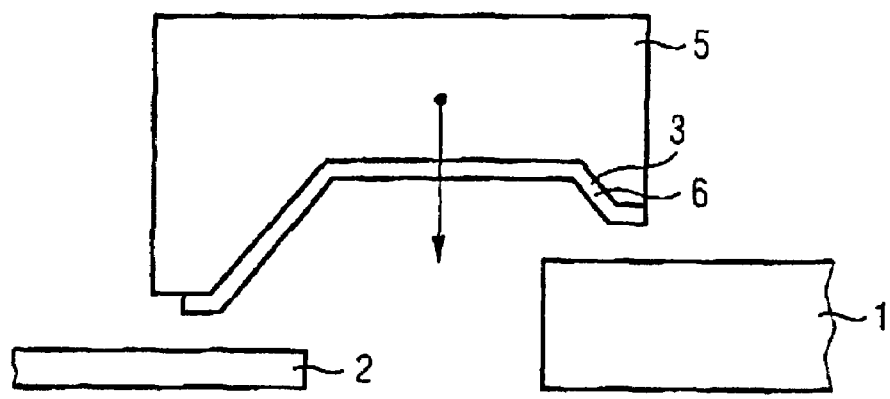
FIG. 1 is a diagrammatic, side-elevational view of an exemplifying embodiment illustrating a bonding process for bonding a circuit to a carrier according to the invention.

In all the figures of the drawing, sub-features and integral parts that correspond to one another bear the same reference symbol in each case. Referring now to the figures of the drawing in detail and first, particularly, to FIG. 1 thereof, there is shown a first embodiment of the inventive configuration. A circuit 1 is disposed adjacent a carrier 2. The circuit 1 can be a circuit produced on a silicon substrate, for example. Substrates composed of gallium arsenide or thin-film materials such as those utilized for the vapor deposition of thin film transistor (TFT) components are also suitable.

The carrier 2 is a lead frame. A lead frame is characterized by conductive regions that contain metallic tracks. The tracks can initially be connected but are usually separated from one another during the fabrication of a bonded and housed integrated circuit.

The carrier 2 can also be a ceramic carrier on which at least one integrated circuit can be mounted. Conductive tracks are disposed in or on the ceramic carrier, usually an isolating base material, and connected at least partially to the circuit 1 by the bonding process.

Likewise, the carrier 2 may also be a printed circuit board (PCB) that is formed from glass fiber-reinforced plastic. The PCB can be constructed as a multilayer stack of conductive and isolating layers with tracks and contacts. But a common characteristic of all the carrier materials is that they include conductive regions that are to be contacted with the circuit. The conductive regions are formed from metals such as copper, aluminum, and so on, which can be tinned.

A setting element 5 is disposed above the carrier 2 and above the circuit 1. On a bottom surface of the setting element 5 is an electrical connection 3, which is formed of a conductive material 6. The conductive material 6 can be gold, copper or aluminum. Alloys containing gold, copper or aluminum can also be utilized. The arrow in FIG. 1 indicates that the setting element 5 is moved next to the circuit 1 and the carrier 2.

Figure 2:
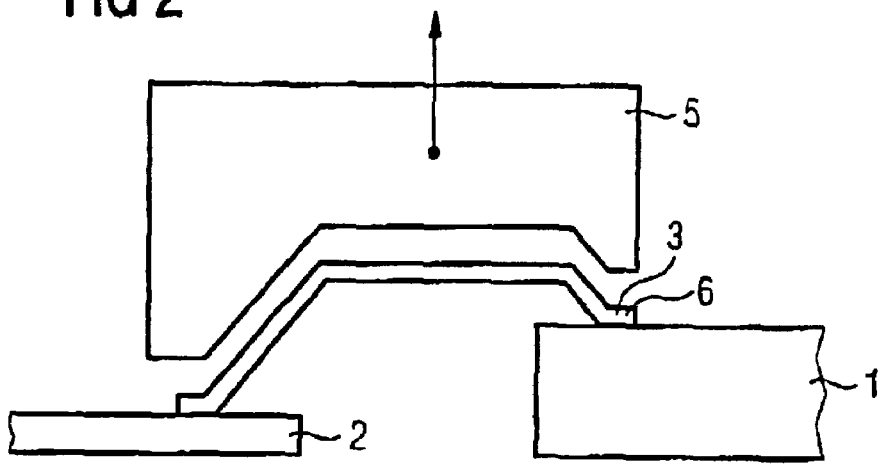
FIG. 2 is a side-elevational view of the exemplifying embodiment of the bonding procedure.

According to FIG. 2, the electrical connection 3 is joined to the circuit 1 and the carrier 2.

The electrical connection 3 also joins the circuit 1 and the carrier 2 even after the setting element 5 is removed from the circuit 1 and carrier 2 as indicated by the arrow.

Figure 3:
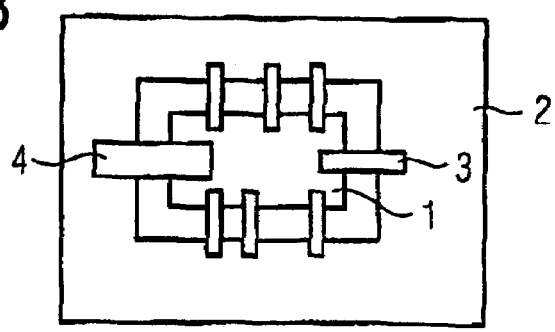
FIG. 3 is a plan view of a configuration with the circuit, the carrier, and bond connections.

FIG. 3 represents a plan view of the circuit 1, the carrier 2, the electrical connection 3 between the circuit 1 and carrier 2, and an additional electrical connection 4 between the circuit 1 and carrier 2. The individual electrical connections can be constructed with different diameters, different heights, and different widths. For instance, lines that carry current can be constructed with a larger cross-section than other lines, for which costs can be lowered by a small cross-section.

Figure 4:
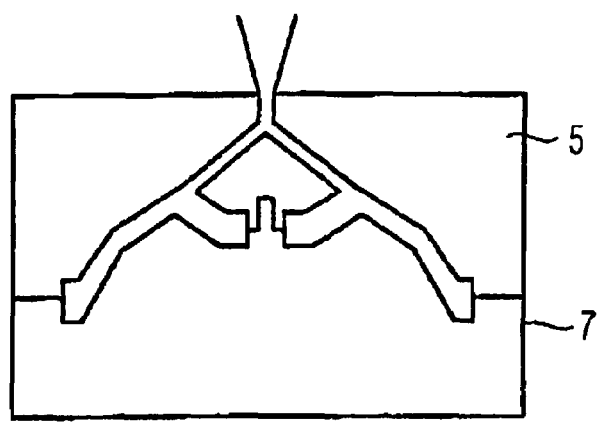
FIG. 4 is a side-elevational view of a mold for producing the bond connections.

FIG. 4 represents a method for fabricating a first electrical connection and the additional electrical connection in a mold 7. The mold 7 formed partly by the setting element 5.

Figure 5:
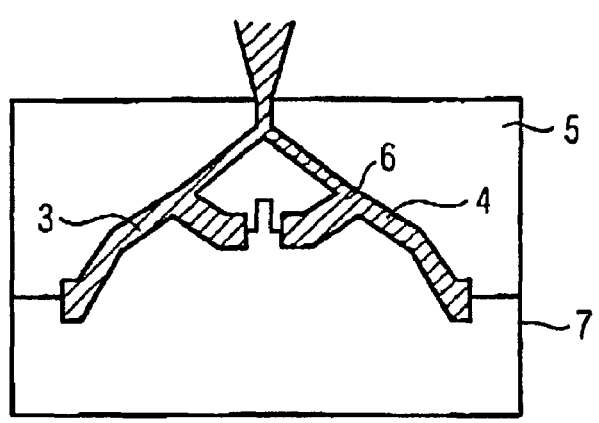
FIG. 5 is a sectional view through the mold shown in FIG. 4, where a conductive material has been poured into the mold.

According to FIG. 5, the conductive material is poured into the funnel above, thereby forming the electrical connection 3 and the additional electrical connection 4.

Figure 6:
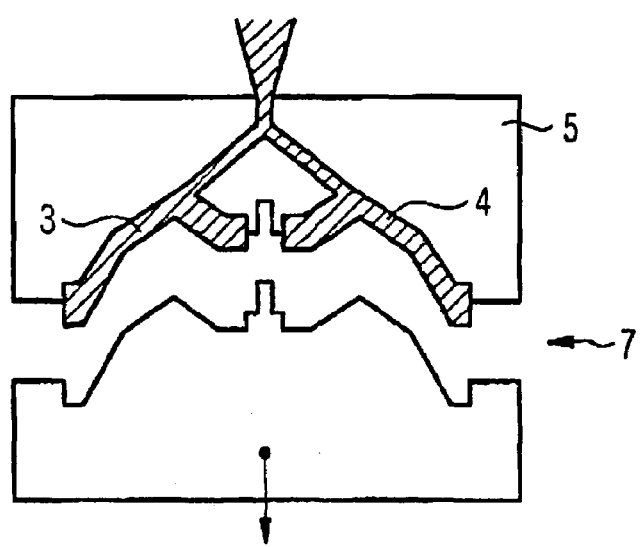
FIG. 6 is a sectional view of the mold subsequent to FIG. 5, in a step which opens the mold.

According to FIG. 6, the mold 7 is opened, whereby the electrical connection 3 and the additional electrical connection 4 remain at the setting element 5.

Figure 7:
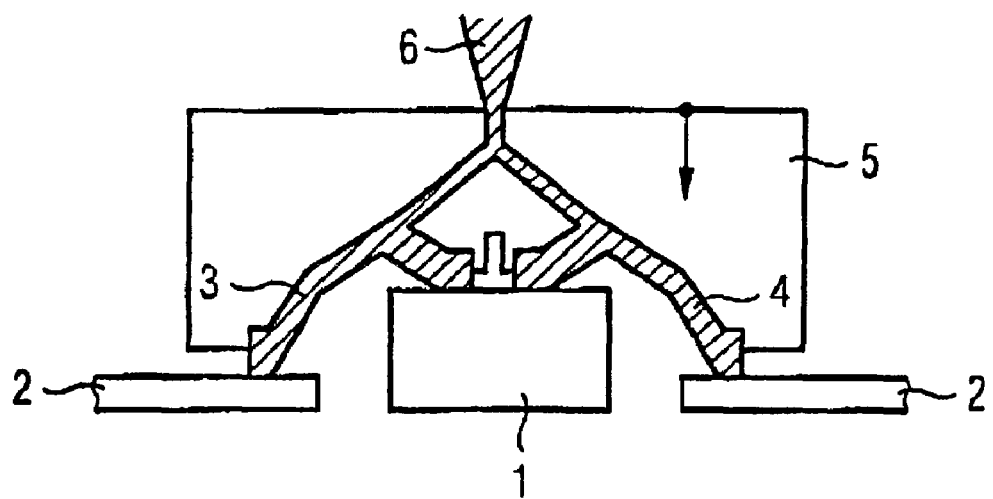
FIG. 7 is a sectional view of a step following FIG. 6, in which the electrical connections are attached to the circuit and the carrier.

According to FIG. 7, the setting element 5 with the electrical connection 3 and the additional electrical connection 4 is pressed onto the circuit 1 and the carrier 2 and joined to the circuit 1 and the carrier 2 by ultrasound, pressure and/or heat.

Figure 8:
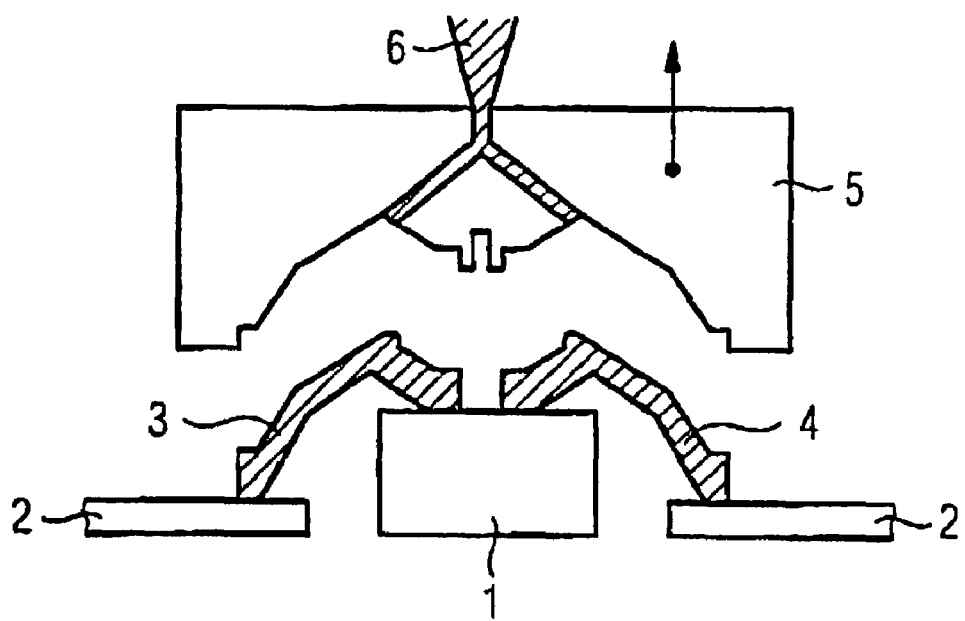
FIG. 8 is a sectional view of a further step following FIG. 7, in which a setting element is removed from the circuit and the carrier following the bonding process.

According to FIG. 8, subsequent to the bonding process, the setting element 5 is removed from the circuit 1 and the carrier 2, whereby the electrical connection 3 and the additional electrical connection 4 remain as bond connections between the circuit 1 and the carrier 2.

I claim:

1. A method for contacting a circuit, which comprises the steps of:
   placing a conductive material into a mold to form at least one solid electrical connection adhering to and protruding from a bottom surface of a setting element;
   disposing a carrier adjacent to the circuit; and
   moving the setting element, to which the solid electrical connection formed of the conductive material adheres and from which the electrical connection protrudes, next to the circuit and the carrier, so that the solid electrical connection simultaneously forms more than one preformed solid electrical connection for conductively joining the circuit to the carrier.

2. The method according to claim 1, which comprises forming all electrical connections between the circuit and the carrier simultaneously.

3. The method according to claim 1, which comprises:
   forming the mold with at least two sections, one of the sections is the setting element; and
   disassembling the mold such that the electrical connection remains adhered to the setting element.

4. The method according to claim 1, which comprises producing the electrical connection between the circuit and the carrier by at least one of pressing the setting element, ultrasound and heat.

5. The method according to claim 1, which comprises removing the setting element from the circuit and the carrier after a bonding process.

6. A configuration, comprising:
   a setting element for simultaneously contacting more than one preformed solid electrical connection between a carrier and an integrated circuit;
   the carrier being disposed adjacent the integrated circuit; and
   said setting element being a portion of a mold for casting said more than one preformed solid electrical connection.

7. The configuration according to claim 6, wherein said more than one preformed solid electrical connection is formed of a conductive material at least partly selected from the group consisting of gold, copper and aluminum.

8. The configuration according to claim 6, wherein the integrated cirduit and the carrier have surfaces to be connected lying on different planes.

* * * * *